(12) United States Patent
Ratcliff

(10) Patent No.: US 9,719,803 B2
(45) Date of Patent: Aug. 1, 2017

(54) MESH NETWORK SYNCHRONOUS POWER MONITORING SYSTEMS AND METHODS

(71) Applicant: Liebert Corporation, Columbus, OH (US)

(72) Inventor: Gregory W. Ratcliff, Delaware, OH (US)

(73) Assignee: Liebert Corporation, Columbus, OH (US)

( * ) Notice: Subject to any disclaimer, the term of this patent is extended or adjusted under 35 U.S.C. 154(b) by 597 days.

(21) Appl. No.: 14/197,594

(22) Filed: Mar. 5, 2014

(65) Prior Publication Data
US 2014/0266784 A1  Sep. 18, 2014

Related U.S. Application Data

(60) Provisional application No. 61/787,444, filed on Mar. 15, 2013.

(51) Int. Cl.
| | |
|---|---|
| *G08C 15/06* | (2006.01) |
| *G08C 19/20* | (2006.01) |
| *G01R 19/00* | (2006.01) |
| *G01R 13/14* | (2006.01) |
| *G01R 1/00* | (2006.01) |
| *G01R 29/00* | (2006.01) |
| *G01D 4/00* | (2006.01) |
| *G01R 21/133* | (2006.01) |
| *G01R 22/06* | (2006.01) |
| *H04Q 9/00* | (2006.01) |

(52) U.S. Cl.
CPC .......... *G01D 4/004* (2013.01); *G01R 21/133* (2013.01); *G01R 22/063* (2013.01); *H04Q 9/00* (2013.01); *H04Q 2209/25* (2013.01); *Y02B 90/242* (2013.01); *Y02B 90/246* (2013.01); *Y04S 20/322* (2013.01); *Y04S 20/42* (2013.01)

(58) Field of Classification Search
None
See application file for complete search history.

(56) References Cited

U.S. PATENT DOCUMENTS

| | | | | |
|---|---|---|---|---|
| 2005/0083206 | A1* | 4/2005 | Couch | G01D 21/00 340/657 |
| 2006/0241880 | A1* | 10/2006 | Forth | G01R 22/10 702/60 |
| 2015/0331024 | A1* | 11/2015 | Bruel | G01R 21/06 324/142 |

OTHER PUBLICATIONS

European Search Report and Opinion for related European Application No. 14159106.5 dated Apr. 7, 2015; 6 pages.

\* cited by examiner

*Primary Examiner* — Firmin Backery
*Assistant Examiner* — Jerold Murphy
(74) *Attorney, Agent, or Firm* — Harness, Dickey & Pierce, P.L.C.

(57) ABSTRACT

A system including a transceiver that is in a first device and receives wirelessly or over a powerline and from a second device, (i) a voltage value of a voltage detected between bus bars of a power source, where the power source supplies power to a load, and where the load is distinct from the first and second devices, or (ii) a current value of a current detected by a current sensor and drawn from the power source by the load. A sensing module one of (i) if the transceiver receives the current, detects the voltage and timestamps the voltage value with a first timestamp, and (ii) if the transceiver receives the voltage, determines the current and timestamps the current value with a second timestamp. A parameter module determines a parameter of the load based on the voltage, the current, and the first and second timestamps.

32 Claims, 6 Drawing Sheets

MESH NETWORK SYNCHRONOUS POWER MONITORING SYSTEMS AND METHODS

CROSS-REFERENCE TO RELATED APPLICATIONS

This application claims the benefit of U.S. Provisional Application No. 61/787,444, filed on Mar. 15, 2013. The entire disclosure of the above application is incorporated herein by reference.

FIELD

The present disclosure relates to power metering systems.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

A power metering system can be used in, for example, a panel breaker box of a building, to determine and report power collectively consumed by loads within the building. The loads may be distributed in the building and thus may be remotely located away from the panel breaker box. The power metering system may include for each phase of alternating current (AC) utility power a voltage sensing module and a current sensing module. The voltage sensing modules and current sensing modules may be connected to a monitoring module. Each of the voltage sensing modules may be connected to respective bus bars via terminals and detect a voltage between a pair of the bus bars. A first bus bar in the pair of bus bars may receive, for example, a single phase of AC utility power. A second bus bar in the pair of bus bars may be at, for example, a neutral potential.

The current sensing modules may be connected via wires to respective current transformers. Each of the current transformers may be on one of the bus bars receiving the AC utility power and detect current drawn collectively by the loads of the building. The current transformer of a current sensing module is located in close proximity to the terminals at which a corresponding voltage is detected. This minimizes distance between the terminals and the current transformer and can minimize time lag between when voltage and current measurements are taken. Close proximity of the terminals and the current transformer also minimizes the amount of power losses between the terminals and the current transformer to allow for an accurate power calculation.

The voltage sensing modules and the current sensing modules may respectively signal condition the detected voltages and currents prior to providing the voltages and currents to the monitoring module. The monitoring module may then determine power drawn collectively by the loads for each of the bus bars receiving AC utility power based on the signal conditioned voltages and currents. The power may be indicated via, for example, a display. The monitoring module may perform for each of the bus bars receiving AC utility power a predetermined number (e.g., 100) of power calculations per cycle of the AC utility power.

SUMMARY

A system is provided and includes a transceiver, a sensing module, a parameter module and a metering module. The transceiver is in a first device and is configured to receive wirelessly or over a powerline and from a second device, (i) a voltage value of a voltage detected between bus bars of a power source, where the power source supplies power to a load, and where the load is distinct from the first device and the second device, or (ii) a current value of a current detected by a current sensor and drawn from the power source by the load. The sensing module is configured to one of (i) if the transceiver receives the current, detect the voltage and timestamp the voltage value with a first timestamp, and (ii) if the transceiver receives the voltage, determine the current and timestamp the current value with a second timestamp. The parameter module is configured to determine at least one parameter of the load based on the voltage, the current, the first timestamp and the second timestamp, where the at least one parameter includes (i) power drawn by the load, and (ii) energy used by the load. The metering module is configured to report the at least one parameter.

In another aspect, a system is provided and includes a source module, a load module, a parameter module and a metering module. The source module is in a first device and is configured to (i) detect a voltage between bus bars of a power source, and (ii) timestamp the voltage with a first timestamp, where the power source supplies power to a load, and wherein the load is distinct from the first device. The load module is in a second device, connected to a current sensor via wires, and configured to, via the wires, detect a current drawn from the power source by the load, where the load module is configured to timestamp the current with a second timestamp. The parameter module is configured to determine a parameter of the load based on the voltage, the current, the first timestamp, and the second timestamp. The metering module is configured to report the parameter.

In another aspect, a system is provided and includes a source module, a load module, a parameter module and a metering module. The source module is in a first device and is configured to detect a voltage between bus bars of a power source, where the power source supplies power to a load, and where the load is distinct from the first device. The load module is in a second device, connected to a current sensor via wires, and configured to, via the wires, detect a current drawn from the power source by the load, where the second device is distinct from the first device. The source module, the load module, and the parameter module are time synchronized with each other and share times when the voltage and the current are detected. The parameter module is configured to determine a parameter of the load based on the voltage, the current and the times when the voltage and the current are detected. The metering module is configured to report the parameter.

Further areas of applicability of the present disclosure will become apparent from the detailed description provided hereinafter. It should be understood that the detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

DETAILED DESCRIPTION

Figure 1:
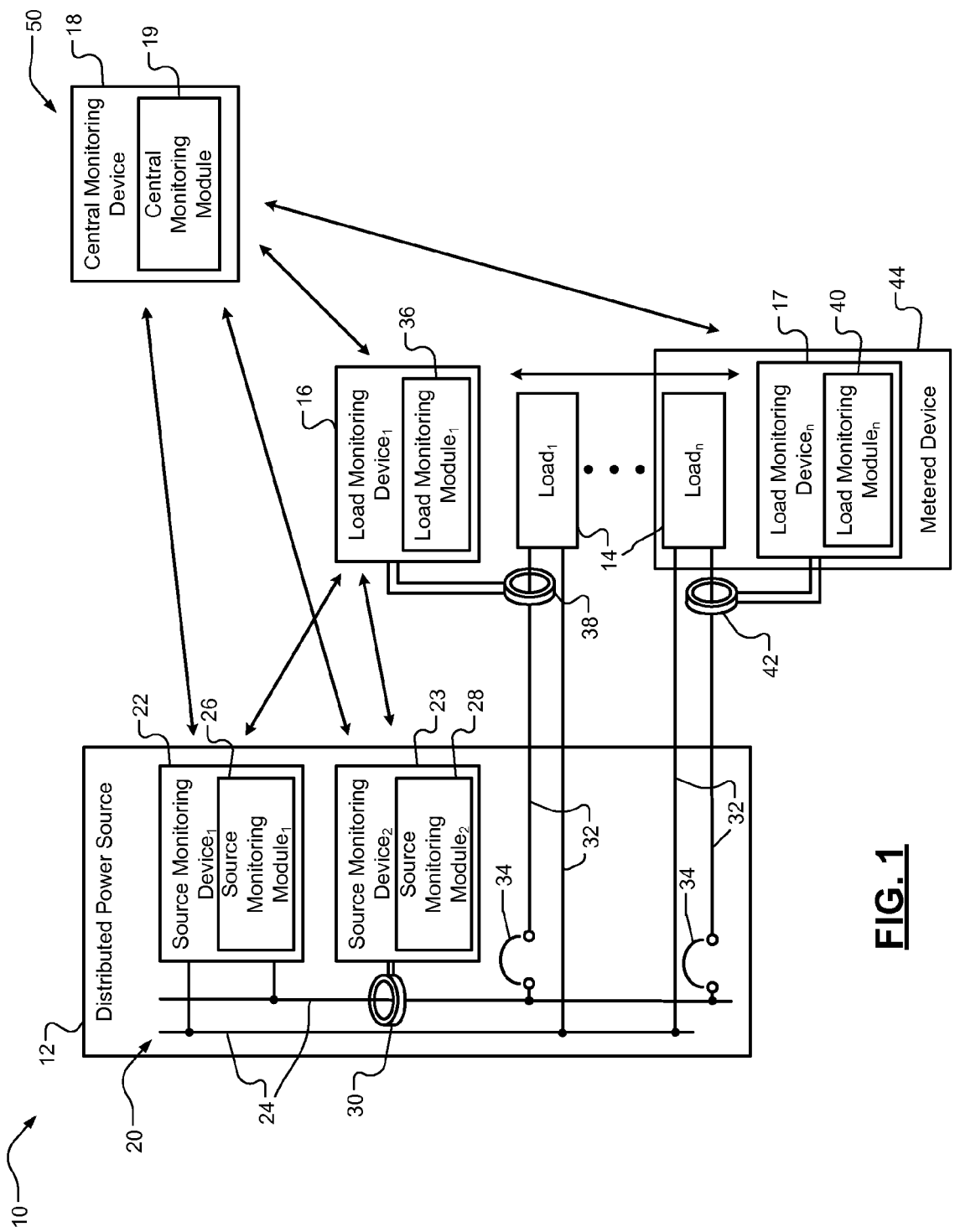
FIG. 1 is a functional block diagram of a distributed power metering system in accordance with an aspect of the present disclosure.

A power metering system may include a voltage sensing module, a current sensing module, and a central monitoring module. The power metering system may be located in a distributed power source, such as a panel breaker box, an uninterruptible power source (UPS), or other power source that provides power to multiple loads. The power metering system may include any number of each of the voltage sensing module and the current sensing module.

The voltage sensing module may be connected to respective bus bars via terminals and detect a voltage between the bus bars. A first one of the bus bars may receive utility power, AC power, a single phase of AC power, or direct current (DC) power. The other bus bar may be at a neutral, a ground, or a reference potential. If multi-phase AC power is monitored, the voltage sensing module may monitor a voltage (i) between a phase of the multi-phase AC power and a neutral potential, or (ii) between two-phases of the multi-phase AC power.

The current sensing module may be connected via wires to a first current transformer (CT). The first CT may be on the first one of the bus bars receiving power and detects current drawn by the loads of the building. The loads may be remotely located away from the distributed power source. The first CT is located in close proximity to the terminals at which the voltage is detected.

Additional CTs may be located in the distributed power source and on power lines providing current to the loads to detect current supplied to each of the loads. Current detected by the additional CTs may be provided to the current sensing module and/or the central monitoring module.

The voltage sensing module and the current sensing module may respectively signal condition the detected voltage and currents prior to providing the voltage and currents to the central monitoring module. The central monitoring module may then determine power drawn collectively by the loads and/or power drawn by each of the loads based on the signal conditioned voltage and currents. The determined power values may be indicated via, for example, a display.

Although the power metering system provides power collectively drawn by the loads and power drawn by each of the loads, the implementation of the power metering system may be difficult to implement. For example, if the power metering system is in a panel breaker box, installation of CTs on each power line of loads being metered can require rewiring of the panel breaker box and/or may not be possible due to lack of space within the panel breaker box. In addition, since the additional CTs are located at the panel breaker box and not at the loads, each current detected by the CTs includes power losses due to impedances of power lines between the panel breaker box and the loads.

To overcome the issues associated with having the CTs in the panel breaker box, the CTs may be located at the respective loads. However, this may require installation of wires and corresponding conduit between (i) the CTs of the respective loads, and (ii) the current sensing module and/or the central monitoring module. Monitoring modules may be located in close proximity to each of the CTs, monitor detected currents, and determine power drawn by a respective load. The monitoring modules may then report the power values to the central monitoring module. This may also require wires between the monitoring modules and the central monitoring module.

The below described distributed power metering systems and methods overcome the above-described issues. The distributed power metering systems may include any number of nodes that are time synchronized with each other. The nodes may provide a mesh network and communicate with each other using a time synchronized mesh protocol (TSMP), powerline and/or other communication standards. The TSMP may satisfy, for example, Institute of Electrical and Electronics Engineers (IEEE) 802.15.4e standards.

In FIG. 1, a distributed power metering system (DPMS) 10 is shown. The DPMS 10 includes a distributed power source 12, loads 14, and load monitoring devices$_{1-n}$ (load monitoring devices 16, 17 are shown). The distributed power source 12 supplies power to the loads 14. Each of the load monitoring devices$_{1-n}$ monitors at least current drawn from the distributed power source 12 by a respective one of the loads 14. The DPMS 10 may include a central monitoring device 18 with a central monitoring module 19. The central monitoring device 18 may be located in the distributed power source 12 or may be located remotely from the distributed power source 12, one or more of the loads 14, and/or one or more of the load monitoring devices$_{1-n}$, as shown.

Figure 2:
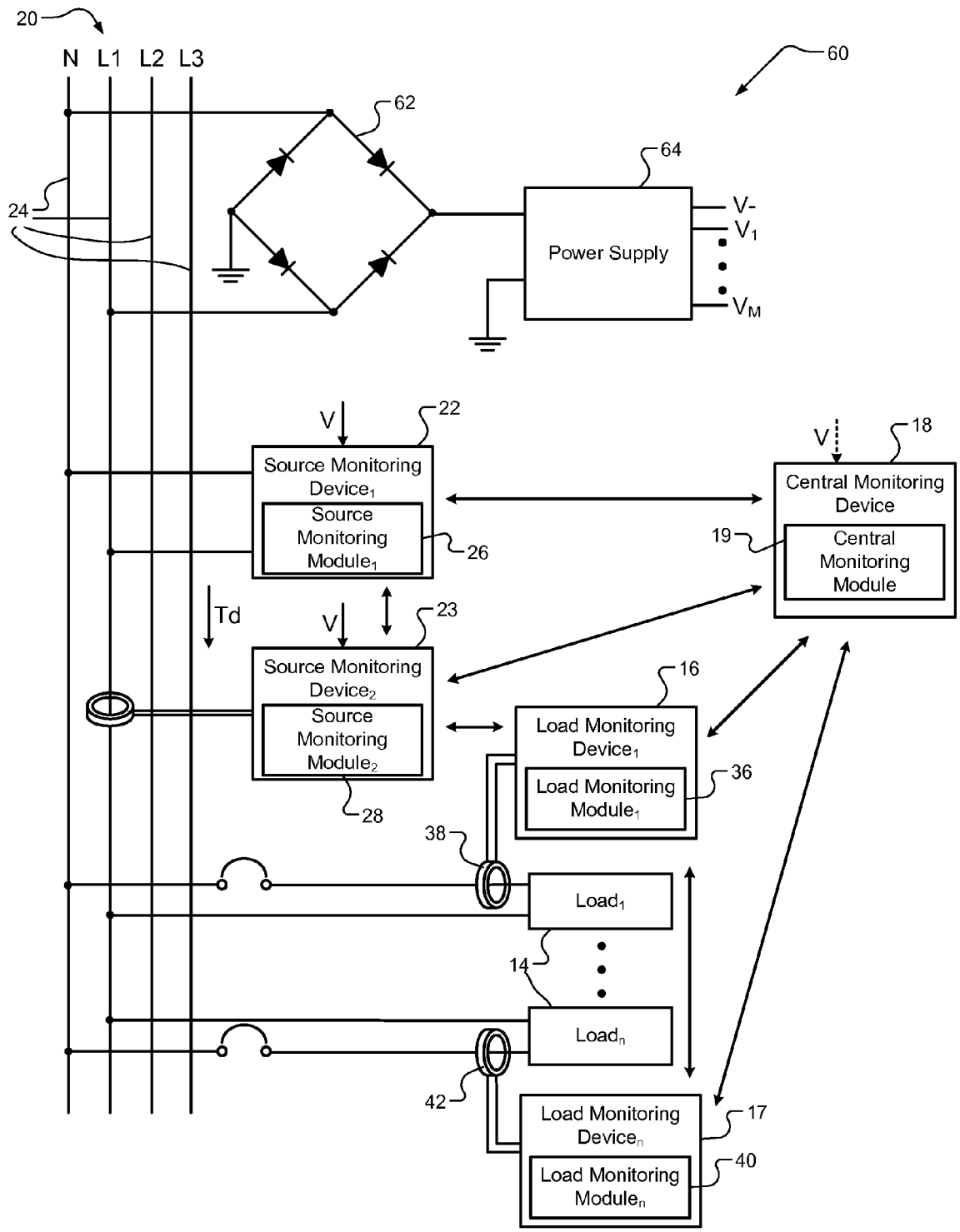
FIG. 2 is a functional block diagram of a portion of the power metering system of claim 1.

The distributed power source 12 may be, for example, a power supply or a panel breaker box, as shown. The distributed power source 12 includes a power bus 20 and source monitoring devices 22, 23. The power bus 20 includes bus bars (or power lines) 24. Although two bus bars are shown, additional bus bars may be included, as shown in FIG. 2. The first source monitoring device 22 (or voltage monitoring device) includes a first source monitoring module (or first voltage monitoring module) 26 that detects voltage between two of the bus bars 24. The bus bars 24 may receive utility power, AC power, or DC power or may be neutral or ground bus bars. The bus bars 24 may receive power from, for example, a power transformer external to a building in which the distributed power source 12 is located. The bus bars 24 may be at various voltage potentials. In AC applications, the bus bars 24 may be at, for example, a ground reference, a neutral reference, 120 VAC, 240 VAC, etc. In DC applications, the bus bars 24 may be at, for example, 48V, 24V, 12V, 5V, 3.3V, 0V, etc.

The second source monitoring device 23 (or current monitoring device) includes a second source monitoring module (or current monitoring module) 28 that detects current drawn by the loads via a first CT 30 or other current sensor, such as a hall effect sensor. The CTs described herein may be, for example, split core CTs to allow for easy installation on a bus bar or power line. The first CT 30 may be located on one of the bus bars 24 upstream from the loads 14. Although shown in separate devices, the source monitoring modules 26, 28 may be located in a single monitoring device.

Figure 5:
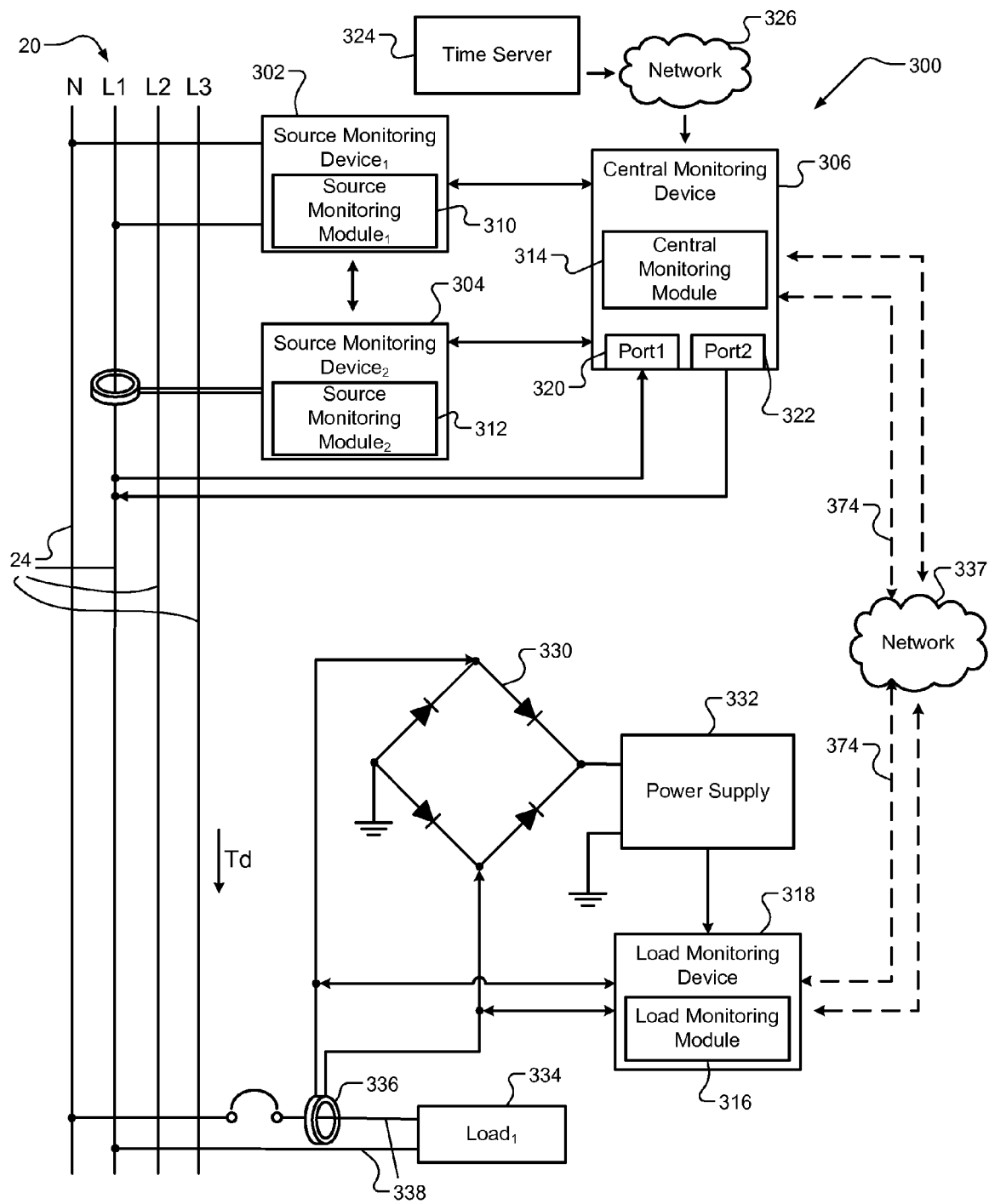
FIG. 5 is a functional block diagram of a portion of another power metering system including powerline, wired and network based communication.

Although a certain number of bus bars, CTs, source monitoring devices, and source monitoring modules are shown, additional ones of each may be included. As an example, four bus bars are shown in FIGS. 2 and 5, as the implementation of FIGS. 2 and 5 are shown for 3-phase AC applications. Also, any number of bus bars, CTs, current sensors, source monitoring devices and/or modules may be included. As an example, a source monitoring device and/or module may be included for each bus bar.

The loads 14 may include facility lights, air conditioning devices, power supplies, and devices located external to or internal to a building. For example, the loads 14 may be on the building (referred to sometimes as roof-top units). The loads 14 may be located in various locations and distances away from the distributed power source 12. Each of the loads 14 may be connected via power lines 32 to two or more of the bus bars 24 in the distributed power source 12. Circuit breakers 34 may be located in the distributed power source 12 and connected between the bus bars 24 and the loads 14.

The load monitoring devices$_{1-n}$ may be located in close proximity to the loads 14 and/or may be located in a same device as a respective one of the loads 14. The load monitoring devices$_{1-n}$ include respective load monitoring modules$_{1-n}$. Two load monitoring devices 16, 17 are shown. The first load monitoring device 16 is located external to a first load Load$_1$ and includes a first load monitoring module 36. The first load monitoring module 36 detects current drawn from the distributed power source 12 by the first load Load$_1$ via a second CT 38 or other current sensor, such as a hall effect sensor. The second CT 38 may be located on one of the power lines 32, remotely away from the distributed power source 12, and in close proximity to the first load Load$_1$ and the first load monitoring device 16. The first load monitoring device 16 is separate from the first load Load$_1$.

The second load monitoring module 40 is located external to a second load Load$_2$ and includes a second load monitoring module 40. The second load monitoring module 40 detects current drawn from the distributed power source 12 by the second load Load$_2$ via a third CT 42 or other current sensor, such as a hall effect sensor. The third CT 42 may be located on one of the power lines 32, remotely away from the distributed power source 12, and in close proximity to the second load Load$_2$ and the second load monitoring device 17. The second load monitoring device 17 is separate from the second load Load$_2$. The second load monitoring device 17 and the second load Load$_2$ may be located in a same metered device 44. The metered device 44 may be, for example, an air conditioner, a power supply, a server, etc.

The source monitoring modules 26, 28, the load monitoring modules$_{1-n}$, and/or the central monitoring module 19 may monitor any number of the loads 14 and monitor and/or determine any number of associated parameters. The parameters may include voltage, current, energy, power, etc. for the loads 14 collectively and/or for each of the loads 14. The source monitoring modules 26, 28, the load monitoring modules$_{1-n}$, and the central monitoring module 19 may communicate with each other and share the parameters determined by any of the modules. As an example, each of the load monitoring modules$_{1-n}$ may monitor and/or determine current, voltage, energy, and/or power of a respective one of the loads 14. The parameters monitored and/or determined by each of the load monitoring modules$_{1-n}$ may be provided to (i) other ones of the load monitoring modules$_{1-n}$, (ii) the source monitoring modules 26, 28, and/or (iii) the central monitoring module 19.

The modules 19, 26, 28 and the load monitoring modules$_{1-n}$ may also relay the parameters from one module to a next module and/or propagate the parameters to any of the modules 19, 26, 28 and the load monitoring modules$_{1-n}$. For example, the voltage detected by the first source monitoring module 22 may be sent to the first load monitoring module 36, which may then send the voltage to the second load monitoring module 40. As another example, the central monitoring module 19 may relay one or more of the parameters between two or more of the source monitoring modules 26, 28 and the load monitoring modules$_{1-n}$.

In one implementation, the central monitoring device 18 is not included in the DPMS 10. One of the source monitoring modules 26, 28 and the load monitoring modules$_{1-n}$ may serve as a central monitoring module and collect parameters associated with the bus bars 24 and/or the loads 14.

The modules 19, 26, 28 and the load monitoring modules$_{1-n}$ are time synchronized, may communicate using a TSMP, transmit and/or receive signals in allocated time slots, and may satisfy the IEEE 802.15.4e standards. The modules 19, 26, 28 and the load monitoring modules$_{1-n}$ may provide and/or be part of a mesh network 50. Each of the modules 19, 26, 28 and the load monitoring modules$_{1-n}$ may be referred to as a node in the mesh network 50. Since the modules (or nodes) in the mesh network 50 are time synchronized and share parameters, any one of the nodes may be able to determine power of one of the loads 14 by determining current, phase lead, phase lag, and voltage peak values for power received by the load 14. Power calculations may be performed based on these values. Each of the current values, phase lead values, phase lag values, voltage peak values, and power values for each of the loads 14 may be received by, stored at, determined at, and/or transmitted from any one of the nodes in the mesh network 50. Several cycles of voltage and/or current may be used when calculating power.

The nodes of the mesh network 50 may have multiple modes of operation including a sleep mode (or low-power mode) and an active mode (or high-power mode). The nodes may awaken (i.e. transition from the sleep mode to the active mode to collect data from other nodes and/or memory, to take measurements, to determine parameters, to transmit data, and/or to report data. A node may return to the sleep mode when predetermined tasks have been completed and/or when the node is not communicating with any other one of the nodes.

The nodes of the mesh network 50 may be time synchronized such that each of the nodes takes a voltage or current measurement during a predetermined time period (e.g., 50 µs). This allows parameters (e.g., energy and power) to be calculated based on these time synchronized measurements.

Referring also to FIG. 2, a portion 60 of the DPMS 10 is shown. The DPMS 10 may include the power bus 20, a bridge rectifier 62, a power supply 64, the source monitoring devices 22, 23, the load monitoring devices$_{1-n}$, the loads 14, and the central monitoring device 18. In the example shown, the power bus 20 includes a neutral bus bar N and bus bars L1-L3 for each of three-phases of AC power. The bridge rectifier 62 may be connected to the neutral bus bar N and one of the other bus bars (e.g., L1) and convert AC power to DC power. The DC power may be provided to the power supply 64, which may then convert a DC input voltage received from the bridge rectifier 62 to multiple DC output voltages V-, $V_1$-$V_M$ (collectively identified as V in FIG. 2). Each of the DC output voltages V may be provided to and power one or more of the source monitoring devices 22, 23 and/or the central monitoring device 18. The bridge rectifier 62 and the power supply 64 may be located along with the source monitoring devices 22, 23 in the distributed power source 12.

The source monitoring devices 22, 23 and the loads 14 may be connected to the neutral bus bar N and one of the bus bars L1-L3. Although in FIG. 2, source monitoring devices 22, 23 are shown as being connected to and/or monitoring the bus bar L1 and not to the bus bars L2, L3, the source monitoring devices 22, 23 and/or other source monitoring modules may be connected to and/or monitor the bus bars L2, L3. Although in FIG. 2, the loads 14 are shown as being connected to the bus bar L1 and not to the bus bars L2, L3, the loads 14 and/or other loads (not shown) may be connected to the bus bars L2, L3. The source monitoring devices 22, 23 include the source monitoring modules 26, 28.

Although the source monitoring devices 22, 23 may be located in the distributed power source 12, the second source monitoring device 23 may be located away from the first source monitoring device 22. There may be a time delay between (i) when the first source monitoring device 22 detects a voltage between two of the bus bars 24 (e.g., N, L1) and (ii) when the second source monitoring device 23 detects current drawn from one of the bus bars 24 (e.g., L1) by the loads 14. This time delay may be accounted for when performing parameter calculations based on a history of parameter measurements, as disclosed herein.

Figure 3:
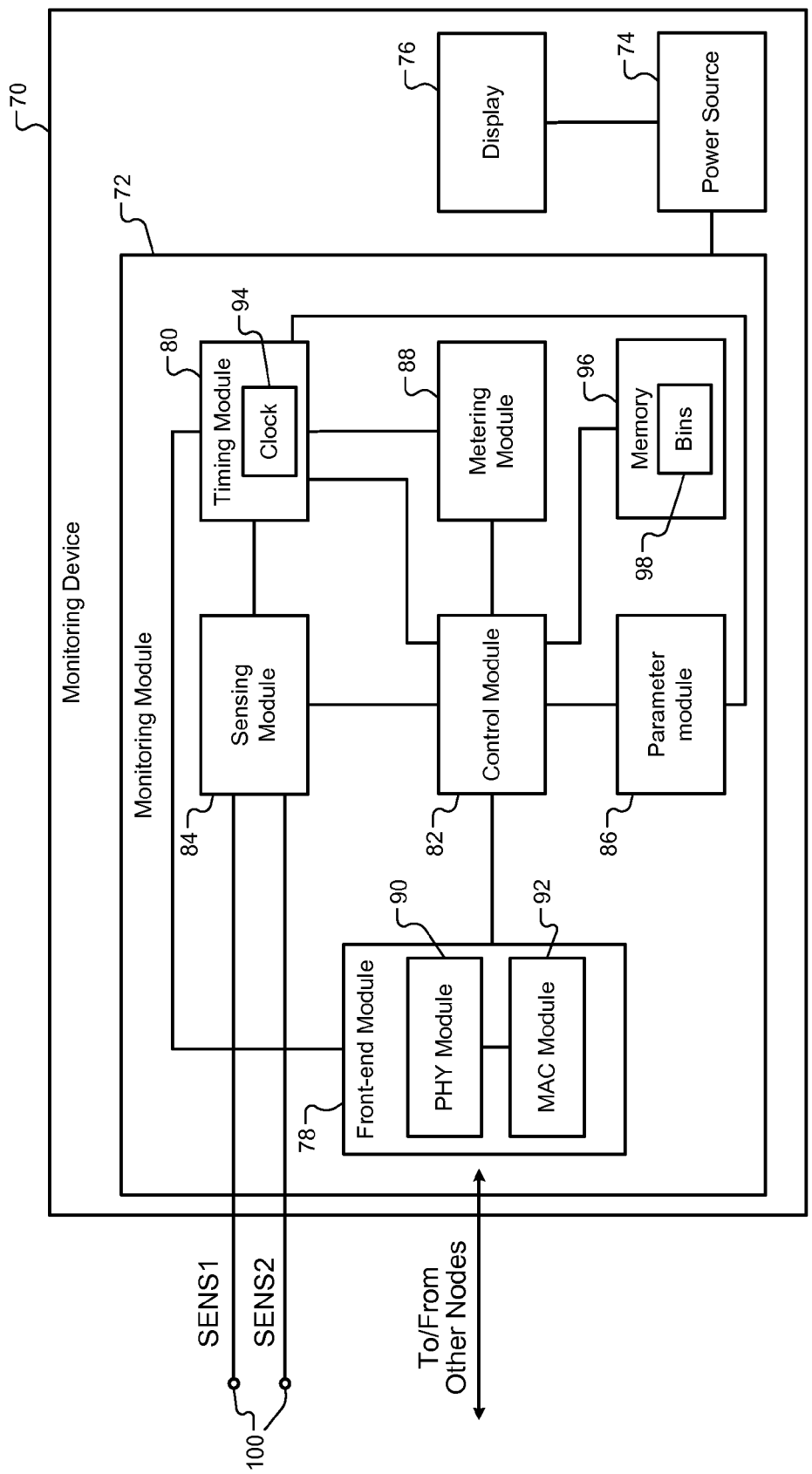
FIG. 3 is a functional block diagram of a monitoring device in accordance with an aspect of the preset disclosure.

The source monitoring modules 26, 28 are time synchronized with each other. Voltage and current measurements taken by the modules 26, 28 are timestamped and stored in memories of the modules 26, 28. Parameter calculations (e.g., energy and power calculations) can be performed based on the voltage and current measurements. Timestamps refer to times when a parameter is detected. An example monitoring module is shown in FIG. 3 and includes a memory in which timestamped parameters may be stored. Any parameters received, detected, measured, and/or determined by the source monitoring modules 26, 28 may be stored in respective memories and shared with each other and/or any other monitoring module in the DPMS 10.

The load monitoring devices 16, 17 include the load monitoring modules 36, 40 and monitor current being received by the loads 14 via the CTs 30, 38, 42. The central monitoring device 18 includes the central monitoring module 19, which may be in communication with each of the source monitoring modules 26, 28 and the load monitoring modules$_{1-n}$. If the central monitoring device 18 is located in the distributed power source 12 or in close proximity to the distributed power source 12, the central monitoring module 19 may receive one or more of the DC output voltages from the power supply 64.

Each of the monitoring devices 18, 22, 23 and load monitoring devices$_{1-n}$ may operate on DC power, which may be received from a power supply (e.g., the power supply 64) or from a DC power source, such as a battery or a battery pack. In one implementation, each of the load monitoring devices$_{1-n}$ has a respective battery pack.

Referring also to FIG. 3, an example monitoring device 70 is shown. The monitoring device 70 may represent any one of the monitoring devices 19, 22, 23 and load monitoring devices$_{1-n}$ of FIGS. 1 and 2. The monitoring device 70 includes a monitoring module 72, a power source 74, and a display 76. The power source 74 may include a battery and/or a battery pack and power the monitoring module 72 and/or the display 76.

The monitoring module 72 may represent anyone of the monitoring modules 19, 26, 28 and load monitoring modules$_{1-n}$ of FIGS. 1 and 2. The monitoring module 72 may include a front-end module 78, a timing module 80, a control module 82, a sensing module 84, a parameter module 86, and a metering module 88. The front-end module 78 includes a physical layer (PHY) module 90 and a media access controller (MAC) module 92. The PHY module 90 may operate as a radio and wirelessly communicate with other nodes (or monitoring modules) in the mesh network 50. The PHY module 90 may communicate with the nodes using designated physical channels and/or logical channels (or time slots) and as a result receive signals on a first set of designated channels and/or time slots and transmit signals on a second set of designated channel and/or time slots. The first set of channels and/or time slots may be the same as, different than, or share one or more of the same channels and/or time slots as the second set of channels and/or time slots. One of the nodes and/or monitoring modules in the mesh network may be designated as a master device and may allocate respective channels and/or time slots for other nodes and/or monitoring modules to prevent signal interference between the nodes and/or monitoring modules. The PHY module 90 may receive parameter signals from and transmit parameter signals to the other nodes.

The parameter signals may include parameters and associated timestamps and/or other timing information (e.g., synchronization information). The synchronization information may be used to synchronize the monitoring module 72 to the other nodes. The synchronization information may include a clock signal, offset values, etc. The timing module 80 may synchronize a clock 94 in the monitoring module 72 and/or adjust timestamping of parameters based on the synchronization information. This assures that the nodes in the mesh network 50 are time synchronized. Each of the modules 78-88 in the monitoring module 72 may receive a clock signal from the clock 94 and/or timing module 80.

The MAC module 92 transfers the parameters, corresponding timestamps, and synchronization information between the PHY module 90 and the control module 82. The control module 82 stores received parameters and timestamps in memory 96 and accesses stored parameters and timestamps from the memory 96. The parameters and timestamps may be stored in memory locations (referred to as bins 98). Each bin may have an associated time when a parameter was received, transmitted, detected, measured, and/or determined. A parameter may have more than one associated time. For example, a parameter may have a detected time, a transmitted time, and a received time. As another example, a parameter may have a determined time, a transmitted time, and a received time. Any of these stored timestamps and/or bin times and/or differences between these timestamps and/or bin times may be used to determine other parameters. For example, power drawn by a load (e.g., Load$_1$) associated with the load monitoring module 36 may be determined based on (i) a detected time and a transmitted time of a voltage between two of the bus bars 24 as determined by the source monitoring module 26, (ii) a received time of the voltage as determined by the load monitoring module 36 may be used to determine, (iii) a detected time of current drawn by the load, and (iv) a difference between the detected times of the voltage and the current.

The sensing module 84 may be connected, via terminals 100, to: the power bus 20 and detect a voltage between bus bars of the distributed power source 12; a CT on a bus bar and detect current drawn collectively by the loads 14; or a CT on a power line and detect current drawn by one of the loads. The signal lines connected to the terminals 100 and/or the signals on the signals lines are identified as SENS1, SENS2. The sensing module 84 may detect or measure a parameter (e.g., voltage or current), timestamp the parameter, and provide the timestamped parameter to the control module 82. The control module 82 may then store the timestamped parameter in a bin of the memory 96.

The parameter module 86 may determine one or more parameters based on (i) other parameters, (ii) corresponding timestamps, and/or (iii) times associated with bins of the parameters in the memory 96. As an example, the parameter module 86, when used in a source monitoring module, may determine energy and/or power drawn by a load based on a voltage value and a current value stored in the memory 96. The voltage value represents a voltage between two of the bus bars 24 and may have been received from a source monitoring module. The current value represents current drawn from a load and may have been received from a load monitoring module. As another example, the parameter module 86 may determine energy and/or power used by a load that is associated with the monitoring device 70 based on voltage and current values and corresponding timestamps stored in the memory 96 and/or associated bin times. This may include determining differences between these timestamps and/or bin times. The voltage and current values may have been received from one or more nodes by the monitoring module 72.

The metering module 88 and/or control module 82 may indicate one or more parameters via the display 76 and/or transmit one or more parameters to one or more nodes via the front-end module 78. This may include reporting and/or transmitting corresponding timestamps. The display 76 may indicate any of the parameters disclosed herein including: current drawn by multiple loads; currents drawn by each load; voltages of bus bars; voltages at CTs or loads; energy used and/or power drawn by loads collectively; energy used and/or power drawn by each load; and power losses associated with power lines between network devices. The network devices may be CTs, monitoring devices, monitoring modules, and/or loads. In the signals transmitted to the one or more nodes, the metering module 88 and/or control module 82 may indicate times that the parameters are transmitted from the monitoring module 72 to the one or more nodes.

Figure 4:
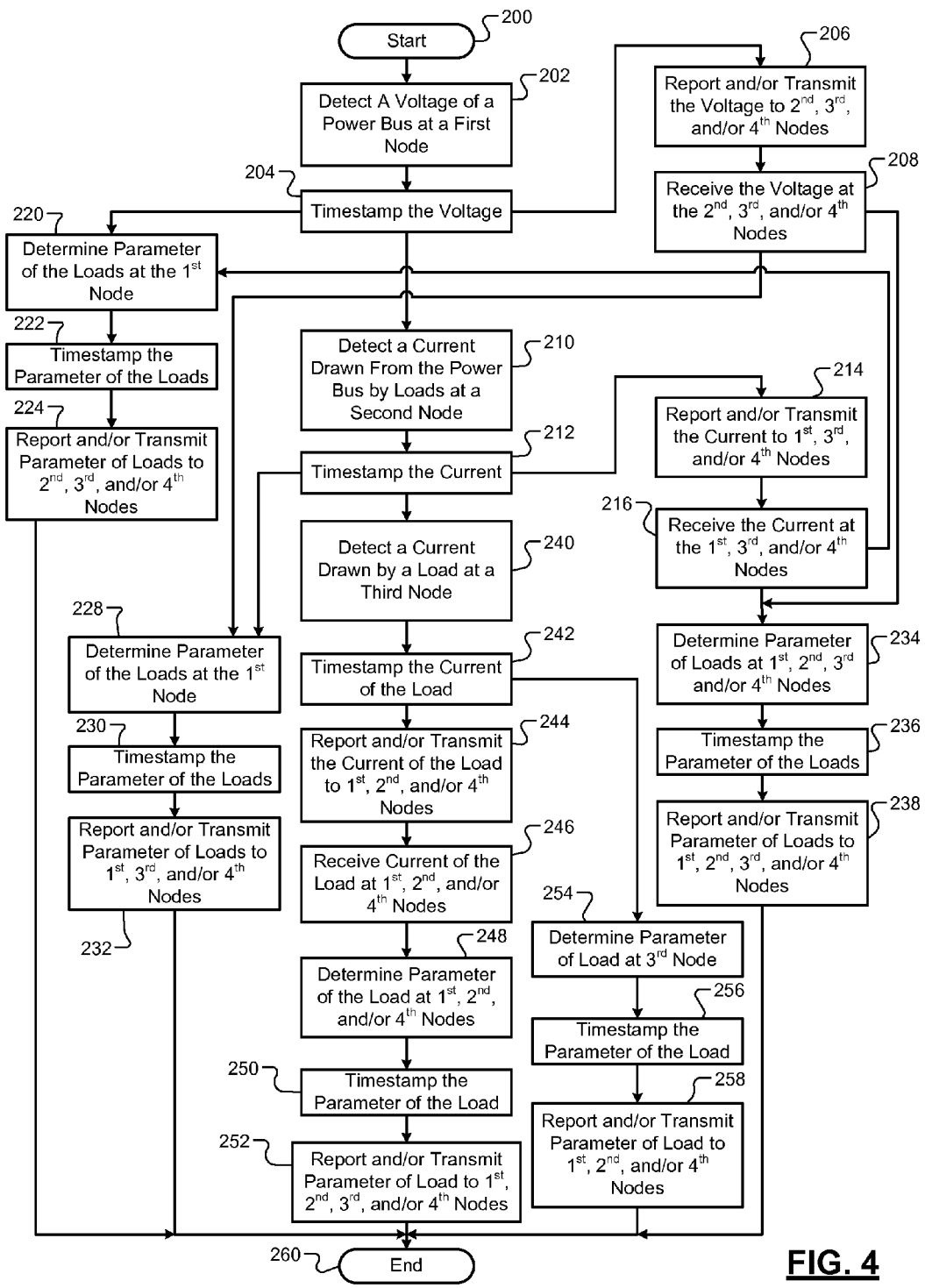
FIG. 4 is a flow diagram illustrating a method of operating a distributed power metering system in accordance with an aspect of the present disclosure.

The monitoring devices and modules disclosed herein may be operated according to numerous methods. Example methods are included in the method of FIG. 4. In FIG. 4, a method of operating a DPMS (e.g., the DPMS 10 of FIGS. 1-2 or a DPMS having a portion of which identified as 300 and shown in FIG. 5) is shown. Although the following tasks are primarily described with respect to the implementations of FIGS. 1-3 and 5-6, the tasks may be easily modified to apply to other implementations of the present disclosure. The tasks may be iteratively performed.

Although various nodes of a mesh network are referred to in the following tasks, the nodes may refer to the monitoring devices and/or monitoring modules of FIGS. 1-3 and 5-6. Also, although the tasks are primarily described with respect to FIGS. 1-3, the tasks may be applied to the implementations of FIGS. 5-6 and the corresponding communication techniques disclosed below with respect to FIGS. 5-6. Also, although the tasks identify various voltages and/or currents, the identified voltages and/or currents may refer to voltage values and current values that represent detected and/or determined voltages and currents. For example, a voltage may be detected and a voltage value representing the detected voltage may be transmitted between monitoring modules. In addition, in the following tasks a certain number of voltage and current measurements are taken. Any number of each may be taken and used to calculate other parameters. A predetermined number of voltage and current measurements may be taken in a predetermined period. Corresponding timestamps and/or bin times may be used and/or compared to determine the other parameters and/or corresponding timestamps. Differences in these timestamps and/or bin times may be used to calculate the other parameters and/or corresponding timestamps. The method may begin at 200.

At 202, a first node (e.g., the first source monitoring module 26) detects a voltage between bus bars of a power bus. At 204, a sensing module of the first node timestamps the detected voltage and stores the timestamped voltage in a memory of the first node.

At 206, a control module and/or metering module of the first node may report the timestamped current via a display and/or transmit via a front-end module the timestamped voltage to a second node (e.g., the second source monitoring module 28), a third node (e.g., one of the load monitoring modules$_{1-n}$), and/or a fourth node (e.g., the central monitoring module 19). The timestamped voltage may be transmitted to the nodes in allocated time slots of the nodes. The timestamped voltage may also be transmitted to other nodes. At 208, the second node, the third node and/or the fourth node may receive the timestamped voltage from the first node in an allocated time slot.

At 210, the second node may detect via a CT a current drawn from the power bus by collectively multiple loads (e.g., the loads 14). At 212, a sensing module of the second node timestamps the detected current and stores the timestamped current in a memory of the second node.

At 214, a control module and/or metering module of the second node may report the timestamped current via a display and/or transmit via a front-end module the timestamped current to the first node, the third node, and/or the fourth node. The timestamped current may be transmitted in allocated time slots of the nodes and to nodes other than the first node, the third node, and/or the fourth node. At 216, the first node, the third node and/or the fourth node may receive the timestamped voltage from the second node in an allocated time slot.

At 220, a parameter module of the first node may determine a parameter of the loads based on the voltage, the current and the corresponding timestamps. The parameter may be based on any number of current and voltage measurements and corresponding timestamps. This holds true for parameters determined by other nodes. The parameter module may, for example, determine energy used collectively by and/or power drawn collectively by the loads.

At 222, the parameter module may timestamp the parameter determined at 220 and store the timestamped parameter in the memory of the first node. The timestamp of the parameter may be based on the timestamps of the current and voltage and/or may indicate a time when the parameter is determined. The timestamp of the parameter may be, for example, an average of the timestamps of current and voltage. The timestamp of the parameter may be based on any number of current and voltage timestamps. This holds true for timestamps of parameters determined by other nodes.

At 224, the control module and/or metering module of the first node may report and/or transmit the parameter timestamped at 222 to the second node, the third node, and/or the fourth node. The timestamped parameter may be transmitted in allocated time slots of the nodes and to nodes other than the second node, the third node, and/or the fourth node.

At 228, a parameter module of the second node may determine a parameter of the loads based on the voltage, the current and the corresponding timestamps. The parameter module of the second node may, for example, determine energy used collectively by and/or power drawn collectively by the loads.

At 230, the parameter module of the second node may timestamp the parameter determined at 228 and store the parameter in the memory of the second node. The timestamp of the parameter determined at 230 may be based on the timestamps of the current and voltage and/or may indicate a time when the parameter is determined. The timestamp of the parameter determined at 230 may be, for example, an average of the timestamps of the current and the voltage.

At 232, the control module and/or metering module of the second node may report and/or transmit the parameter timestamped at 230 to the first node, the third node, and/or the fourth node. The timestamped parameter determined at 230 may transmitted in allocated time slots of the nodes and to nodes other than the first node, the third node, and/or the fourth node.

At 234, a parameter module of the third node and/or a parameter module of the fourth node may determine a parameter of the loads based on the voltage, the current and the corresponding timestamps. The parameter modules of the third and fourth nodes may, for example, determine energy used collectively by and/or power drawn collectively by the loads.

At 236, the parameter modules of the third and fourth nodes may timestamp the parameters determined at 234 and store the parameters in respective memories of the third and fourth nodes. The timestamps of the parameters determined at 236 may be based on the timestamps of the current and voltage and/or may indicate times when the parameters are determined. Each of the timestamps of the parameters determined at 236 may be, for example, an average of the timestamps of the current and the voltage.

At 238, control modules and/or metering modules of the third node and/or the fourth node may report and/or transmit the parameters timestamped at 236 to the first node, second node, the third node, and/or the fourth node. The timestamped parameters determined at 236 may be transmitted in allocated time slots of the nodes and to nodes other than the first node, second node, the third node, and/or the fourth node.

Although the following tasks 240-258 are described with respect to a single load and corresponding parameters of that load, additional nodes may monitor and/or determined parameters of other loads. At 240, a sensing module of the third node detects via a second CT a current drawn by one of the loads.

At 242, sensing module of the third node timestamps the current of the load and stored the current in a memory of the third node.

At 244, a control module and/or metering module of the third node may report and/or transmit the timestamped current of the load to the first node, the second node and/or the fourth node. The timestamped current may also be transmitted to other nodes. At 246, the timestamped current transmitted at 244 may be received at the first node, the second node and/or the fourth node in allocated time slots. At 248, parameter modules of the first node, the second node and/or the fourth node may determine a parameter (e.g., energy and power) of the load based on the timestamped voltage and current of the load and the corresponding timestamps. At 250, the parameter modules of the first node, the second node and/or the fourth node may timestamp the parameters determined at 248.

At 252, the control modules and/or metering modules of the first node, the second node and/or the fourth node may report and/or transmit the parameters timestamped at 250 to the first node, the second node, the third node and/or the fourth node. The parameter timestamped at 250 may be transmitted in allocated time slots of the nodes and to nodes other than the first node, the second node, the third node and/or the fourth node.

At 254, the parameter module of the third node determines a parameter (e.g., energy and power) of the load (e.g., the load $Load_1$) associated with the third node based on the voltage timestamped at 204, the current timestamped at 242 and the corresponding timestamps. At 256, the parameter module may timestamp the parameter determined at 254. At 258, the control module and/or metering module of the third node may report and/or transmit the parameter timestamped at 256 to the first node, the second node and/or the fourth node. The parameter timestamped at 258 may be transmitted in allocated time slots of the nodes and to nodes other than the first node, the second node and/or the fourth node. The method may end at 260.

In the above-described tasks, voltages at the CTs (referred to as CT voltages) may be estimated based on: the timestamped voltage; predetermined distances between (i) terminals where the timestamped voltage is detected on the power bus and (ii) the CTs; and predetermined impedances of power lines between (i) the terminals where the timestamped voltage is detected on the power bus and (ii) the CTs. Each of the CT voltages refers to a voltage between power lines at a point where the CT is located on one of the power lines. The parameters (e.g., energy and power) of the loads collectively and/or of each load may be determined by the parameter modules based on (i) the associated CT voltage, and (ii) a corresponding current.

The above-described tasks are meant to be illustrative examples; the tasks may be performed sequentially, synchronously, simultaneously, continuously, during overlapping time periods or in a different order depending upon the application. Also, any of the tasks may not be performed or skipped depending on the implementation and/or sequence of events.

In FIG. 5, a portion 300 of another distributed power metering system that uses powerline, wired and network based communication is shown. The distributed powerline metering system may include the power bus 20, source monitoring devices 302, 304, and a central monitoring device 306. The source monitoring devices 302, 304 may include respective source monitoring modules 310, 312, which may operate similar to the source monitoring modules 26, 28 of FIG. 2, however may communicate with the central monitoring device 306 using wireless or wired communication.

The central monitoring device 306 may include a central monitoring module 314, which may operate similar to the central monitoring module 19 of FIG. 2, except may communicate with the source monitoring modules 310, 312 and a load monitoring module 316 of a load monitoring device 318 via powerline, wired and/or wired communication. The central monitoring device 306 may include ports 320, 322, which may respectively be used to transfer timestamped parameters onto powerlines N, L1-L3 of the power bus 20 and receive timestamped parameters from the powerlines N, L1-L3. The timestamped parameters transferred onto may be provided to other nodes (e.g., the load monitor device) and the timestamped parameters received from the powerlines N, L1-L3 may be received from the nodes. Although not shown, the source monitoring devices 302, 304 may transfer timestamped parameters onto or receive timestamped parameters from the powerlines N, L1-L3. The timestamped parameters may be voltage, current, power and/or other timestamped parameters disclosed herein.

The central monitoring device 306 may receive a clock signal and/or a current time from a time server 324 via a network 326. The central monitoring module 314 may then timestamp parameters collected via the source monitoring devices 302, 304. This time information may be provided to the source monitoring modules 310, 312 and the load monitoring module 316. Although a certain number of load monitoring devices, source monitoring devices and central monitoring devices are shown, any number of each may be included. As disclosed above all of these devices may share parameters and/or timestamped parameters and/or calculations determined based on these parameters with each other using the various communication techniques disclosed herein. The shared time provides time synchronization of the nodes (e.g., the source monitoring modules 310, 312, the central monitoring module 314 and the load monitoring module 316). As another example, the nodes may determine current times using global positioning system(s) and corresponding signals. Each node may receive global position system (GPS) signals having time information. Any of the nodes and/or monitoring modules may timestamp detected and/or determined parameters.

As an example, powerline carrier communication may be used to carry synchronized messages between the nodes including calculations that provide point of use power, power factors, currents, and other parameters detected and/or determined may be transferred. The times for signals to be propagated down a wire can be utilized to manage time delays and power readings such that precise correlation and bindings to measured readings are utilized for accurate calculations. As an example, an applied time (time used for a calculation of a parameter, such as power) may be equal to a measured time (time when a parameter, such as current, is timestamped and/or measured) plus or minus a difference in time or time delay (travel and/or processing time associated with the measured time). These calculations may be performed using a predetermined number of readings to provide a stream of timestamped parameter (e.g., timestamped current) measurements. As an example, 64 bins may be used for 64 timestamped parameter values per phase of 60 Hz, AC power. In addition or as an alternative to powerline parameter transfers, synchronized wired (e.g., Ethernet) transfers of parameters may be performed.

The distributed power metering system may further include a bridge rectifier 330, a power supply 332, and a load 334. The bridge rectifier 330 may supply power to the power supply 332, which may in turn supplies power to the load monitoring device 318. In one implementation, the power supply 332 receives power from the bridge rectifier 330 and from a power source (e.g., a battery pack). The power source may be included in the power supply 332. In another implementation, the power supply 332 does not receive power from the bridge rectifier 330 and receives power from a power source (e.g., a battery pack). The bridge rectifier 300 may receive power via a powerline transceiver current transformer 336. The powerline transceiver current transformer 336 may be for multiple purposes including providing power to the bridge rectifier 330, indicating current supplied to the load 334, and/or communicating parameters transferred onto the power bus 20 and thus onto power lines 338 of the load 334.

The load monitoring device 318 may include the load monitoring module 316. The load monitoring module 316 may operate similar to the load monitoring modules 36, 40 of FIGS. 1 and 2. The load monitoring module 316 may however monitor current detected by the powerline transceiver current transformer 336 and receive and/or transmit parameters to and from the powerline transceiver current transformer 336. The load monitoring module 316 may communicate with the central monitoring device 306 via the powerlines N, L1-L3, wirelessly via a local area network (LAN) 337, directly, and/or using wired communication protocols. This communication may include the transfer of parameters and/or calculated information disclosed herein.

Figure 6:
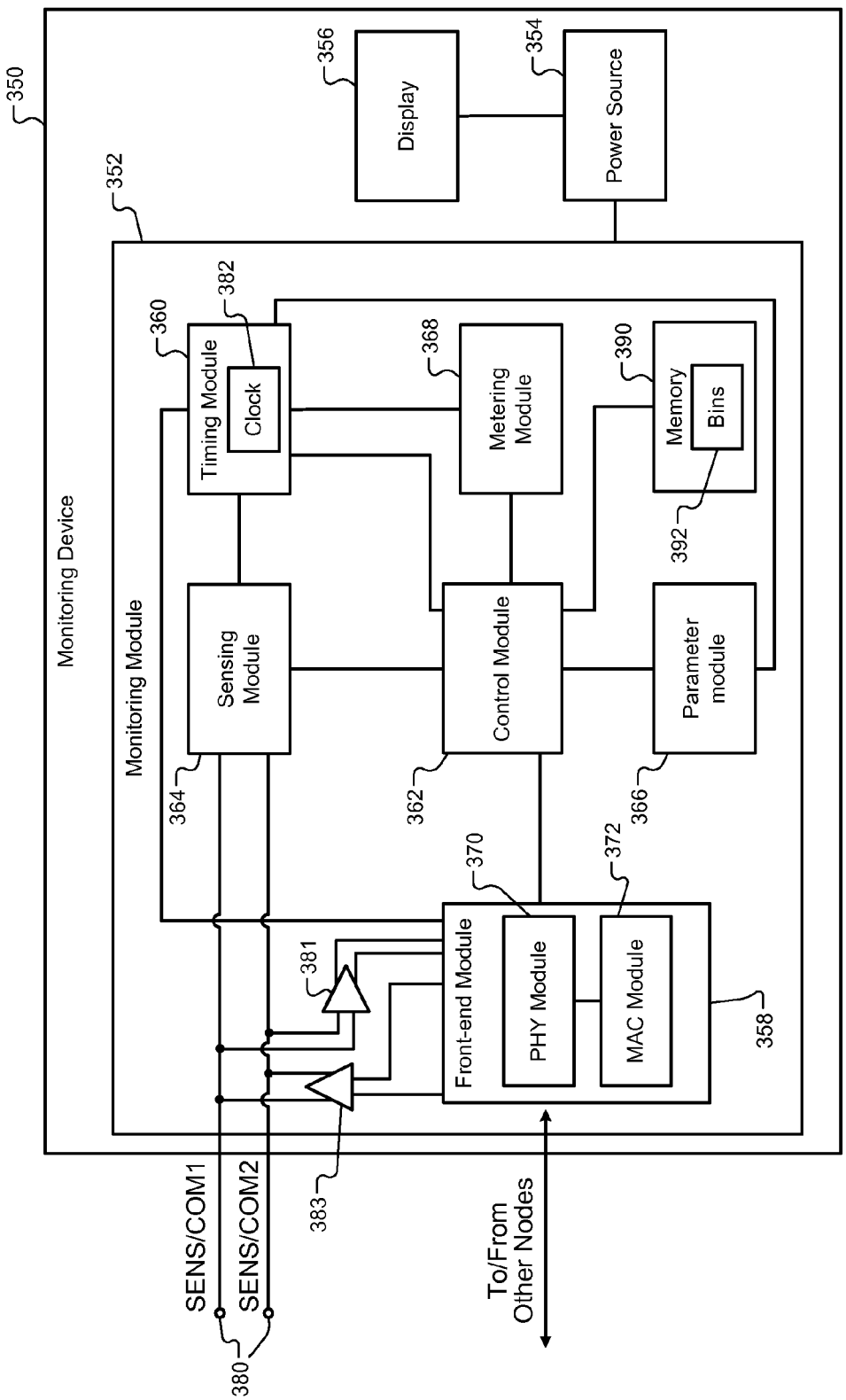
FIG. 6 is a functional block diagram of another monitoring device for the system of FIG. 5.

Referring now also to FIG. 6, an example monitoring device 350 for the system of FIG. 5 is shown. The monitoring device 350 is similar to the monitoring device 70 of FIG. 3, but allows for wireless, wired, network-based, and/or powerline communication, as disclosed above.

The monitoring device 350 is configured to communicate using powerline, wireless network-based, and/or wired communication to communicate with other nodes and/or monitoring devices. The monitoring device 350 may represent any one of the monitoring devices of FIG. 5 (e.g., the monitoring devices 302, 304, 306, 318). The monitoring device 350 may include a monitoring module 352, a power source 354, and a display 356. The power source 354 may include a battery and/or a battery pack and power the monitoring module 352 and/or the display 356. The power source 354 may receive power from the power supply 332. In one implementation, the power source 354 does not receive power from the power supply 332.

The monitoring module 352 may represent anyone of the monitoring modules of FIG. 5 (e.g., the modules 310, 312, 314, 316). The monitoring module 352 may include a front-end module 358, a timing module 360, a control module 362, a sensing module 364, a parameter module 366, and a metering module 368. The front-end module 358 includes a physical layer (PHY) module 370 and a media access controller (MAC) module 372. The PHY module 370 may operate as a radio and wirelessly communicate with other nodes (or monitoring modules) in one or more mesh and/or non-mesh networks and/or communicate via wired connections (e.g., wires between the monitoring device 352 and other nodes and/or monitoring devices). Examples of wired connections are shown by dashed lines 374 in FIG. 5, which may be connected to the LAN 337 or may provide a direct connection between the corresponding nodes (e.g., the monitoring devices 306 and 318).

The PHY module 370 may communicate with other nodes (or monitoring modules): in one or more networks (mesh and/or non-mesh networks); wirelessly; using wired connections, and/or over powerlines. Wireless and wired communication with other nodes is designated by solid line. Powerline monitoring and communication over the powerlines is designated by SENS/COM1, SENS/COM2 with terminals 380 connected to a powerline transceiver current transformer (e.g., the transformer 336), as described above. Communication and/or parameter signals received and/or transmitted onto the powerlines may be amplified via respective amplifiers 381, 383, which may be included in the PHY module 358 or may be separate from the front-end module 358 as shown.

The PHY module 370 may communicate with the nodes using designated physical channels and/or logical channels (or time slots) and as a result receive signals on a first set of designated channels and/or time slots and transmit signals on a second set of designated channel and/or time slots. The first set of channels and/or time slots may be the same as, different than, or share one or more of the same channels and/or time slots as the second set of channels and/or time slots. One of the nodes and/or monitoring modules may be designated as a master device and may allocate respective channels and/or time slots for other nodes and/or monitoring modules to prevent signal interference between the nodes and/or monitoring modules. The PHY module 370 may receive parameter signals from and transmit parameter signals to the other nodes.

The parameter signals may include parameters and associated timestamps and/or other timing information (e.g., synchronization information). The synchronization information may be used to synchronize the monitoring module 352 to the other nodes. The synchronization information may include a clock signal, offset values, etc. The timing module may synchronize a clock 382 in the monitoring module 352 and/or adjust timestamping of parameters based on the synchronization information. The clock may be synchronized with a clock signal received from the time server and/or with a GPS clock signal. This assures that the nodes in the mesh and non-mesh networks are time synchronized. Each of the modules 358-366 in the monitoring module 352 may receive a clock signal from the clock 382 and/or the timing module 360.

The MAC module 372 transfers the parameters, corresponding timestamps, and synchronization information between the PHY module 370 and the control module 362. The control module 362 stores received parameters and timestamps in memory 390 and accesses stored parameters and timestamps from the memory 390. The parameters and timestamps may be stored in memory locations (referred to as bins 392). Each bin may have an associated time when a parameter was received, transmitted, detected, measured, and/or determined. A parameter may have more than one associated time. For example, a parameter may have a detected time, a transmitted time, and a received time. As another example, a parameter may have a determined time, a transmitted time, and a received time. Any of these stored timestamps and/or bin times and/or differences between these timestamps and/or bin times may be used to determine other parameters. For example, power drawn by a load (e.g., the load 334) associated with the load monitoring module 316 may be determined based on (i) a detected time and a transmitted time of a voltage between two of bus bars as determined by the source monitoring module 310, (ii) a received time of the voltage as determined by the load monitoring module 316 may be used to determine, (iii) a detected time of current drawn by the load 334, and (iv) a difference between the detected times of the voltage and the current.

The sensing module 364 may be connected, via terminals 380, to: the power bus 20 and detect a voltage between bus bars of a distributed power source; a powerline transceiver CT or other current sensor on a bus bar and detect current drawn collectively by the loads; or a powerline transceiver CT or other current sensor on a power line and detect current drawn by one of the loads. The signal lines connected to the terminals 380 and/or the signals on the signals lines are identified as SENS/COM1, SENS/COM2. The sensing module 364 may detect or measure a parameter (e.g., voltage or current), timestamp the parameter, and provide the timestamped parameter to the control module 362. The control module 362 may then store the timestamped parameter in a bin of the memory 390.

The parameter module 366 may determine one or more parameters based on (i) other parameters, (ii) corresponding timestamps, and/or (iii) times associated with bins of the parameters in the memory 390. As an example, the parameter module 366, when used in a source monitoring module, may determine energy and/or power drawn by a load based on a voltage value and a current value stored in the memory 390. The voltage value represents a voltage between two of bus bars and may have been received from a source monitoring module. The current value represents current drawn from a load and may have been received from a load monitoring module. As another example, the parameter module 366 may determine energy and/or power used by a load that is associated with the monitoring device based on voltage and current values and corresponding timestamps stored in the memory and/or associated bin times. This may include determining differences between these timestamps and/or bin times. The voltage and current values may have been received from one or more nodes by the monitoring module 352.

The metering module 368 and/or control module 362 may indicate one or more parameters via the display 356 and/or transmit one or more parameters to one or more nodes via the front-end module 358. This may include reporting and/or transmitting corresponding timestamps. The display 356 may indicate any of the parameters disclosed herein including: current drawn by multiple loads; currents drawn by each load; voltages of bus bars; voltages at current sensors or loads; energy used and/or power drawn by loads collectively; energy used and/or power drawn by each load; and power losses associated with power lines between network devices. The network devices may be current sensors, monitoring devices, monitoring modules, and/or loads. In the signals transmitted to the one or more nodes, the metering module and/or control module may indicate times that the parameters are transmitted from the monitoring module to the one or more nodes.

The above-described techniques allow any number of CTs to be leveraged to monitor parameters of any number of loads from any number of nodes in a mesh network. The CTs may be used as mesh network based sensors that can be deployed away from a distributed power source and/or voltage sensing devices (e.g., the first source monitoring device 22 of FIG. 1. CTs and corresponding monitoring modules are easily deployed and distributed in a building in large numbers. The CTs and corresponding monitoring modules: may be self-powered (have associated power sources such as battery packs); and can have a long operating life due to minimal active operating time periods. The CTs and corresponding monitoring modules provide accurate timestamping of collected data and allow post processing techniques to be used to perform parameter calculations. The use of the CTs and corresponding monitoring modules minimizes integration and installation at each point in a network.

The above-described techniques provide DPMSs that each may include a single voltage sense point (or voltage sensing point for each phase of AC power received), as opposed to having multiple voltage sense points. The DPMSs provide comprehensive data acquisition and distribution systems with synchronized nodes that may operate dependently on each other.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. For purposes of clarity, the same reference numbers will be used in the drawings to identify similar elements. As used herein, the phrase at least one of A, B, and C should be construed to mean a logical (A or B or C), using a non-exclusive logical OR. It should be understood that one or more steps within a method may be executed in different order (or concurrently) without altering the principles of the present disclosure.

As used herein, the term module may refer to, be part of, or include an Application Specific Integrated Circuit (ASIC); a discrete circuit; an integrated circuit; a combinational logic circuit; a field programmable gate array (FPGA); a processor (shared, dedicated, or group) that executes code; other suitable hardware components that provide the described functionality; or a combination of some or all of the above, such as in a system-on-chip. The term module may include memory (shared, dedicated, or group) that stores code executed by the processor.

The term code, as used above, may include software, firmware, and/or microcode, and may refer to programs, routines, functions, classes, and/or objects. The term shared, as used above, means that some or all code from multiple modules may be executed using a single (shared) processor. In addition, some or all code from multiple modules may be stored by a single (shared) memory. The term group, as used above, means that some or all code from a single module may be executed using a group of processors. In addition, some or all code from a single module may be stored using a group of memories.

The apparatuses and methods described herein may be partially or fully implemented by one or more computer programs executed by one or more processors. The computer programs include processor-executable instructions that are stored on at least one non-transitory tangible computer readable medium. The computer programs may also include and/or rely on stored data. Non-limiting examples of the non-transitory tangible computer readable medium include nonvolatile memory, volatile memory, magnetic storage, and optical storage.

What is claimed is:

1. A system comprising:
   a transceiver in a first device and configured to receive wirelessly or over a first powerline and from a second device (i) a voltage value of a first voltage detected between two of a plurality of bus bars, wherein the plurality of bus bars are in a distributed power source, wherein the distributed power source supplies power from the two of the plurality of bus bars to a load, and wherein the load is distinct from the first device and the second device, or (ii) a first current value of a current detected by a current sensor and drawn from the two of the plurality of bus bars by the load, wherein the current sensor is remotely located away from the distributed power source;
   a sensing module configured to one of (i) if the transceiver receives the first current value, detect the first voltage and timestamp the voltage value with a first timestamp, and (ii) if the transceiver receives the voltage value, determine a second current value of the current drawn by the load and timestamp the second current value with a second timestamp;
   a parameter module configured to
      estimate a second voltage at the current sensor based on
         the voltage value,
         the first timestamp,
         a predetermined distance between (i) terminals where the first voltage is detected at the two of the plurality of bus bars and (ii) the current sensor, and
         a predetermined impedance of power lines between (i) the terminals where the first voltage is detected at the two of the plurality of bus bars and (ii) the current sensor,
      wherein the second voltage is different than the first voltage, and
   determine at least one parameter of the load based on (a) the second voltage, (b) the first current value or the second current value, (c) the first timestamp, and (d) the second timestamp, wherein the at least one parameter includes (i) power drawn by the load, and (ii) energy used by the load; and
   a metering module configured to report the at least one parameter.

2. The system of claim 1, wherein:
   the first device and the second device are mesh nodes of a mesh network;
   the parameters include the at least one parameter;
   the mesh nodes are time synchronized such that each of the nodes takes a voltage or current measurement during a predetermined period of time;
   the voltage or current measurement of the first device corresponds to the voltage value or the second current value;
   each of the mesh nodes is configured to (i) share the corresponding voltage or current measurement, and (ii) determine the at least one parameter; and
   the transceiver communicates with the second device using a time synchronized mesh protocol.

3. The system of claim 2, further comprising a timing module configured to be time synchronized with the second device, wherein:
   signals transmitted between the transceiver and the second device are transmitted in allocated time slots; and
   the voltage value or the first current value is received by the transceiver in one of the allocated time slots.

4. The system of claim 1, wherein the first current value is equal to the second current value.

5. The system of claim 1, further comprising a power supply configured to receive power from the current sensor and power at least a portion of the first device via the power received from the current sensor, wherein:
   the transceiver is configured to wirelessly receive the voltage value from the second device; and
   the sensing module is connected to the current sensor via wires and is configured to receive the current or the second current value from the current sensor via the wires.

6. The system of claim 1, wherein:
   the sensing module is connected to the two of the plurality of bus bars of the distributed power source and detects the first voltage between the two of the plurality of bus bars; and
   the transceiver is configured to transmit the voltage value or the second voltage to the second device via the first powerline or the two of the plurality of bus bars.

7. The system of claim 1, comprising:
   the first device, wherein the first device comprises the transceiver, the sensing module, the parameter module and the metering module; and
   the second device,
   wherein the first device and the second device are mesh nodes of a mesh network and communicate with each other using a time synchronized mesh protocol.

8. The system of claim 1, comprising:
the first device, wherein the first device comprises the transceiver, the sensing module, the parameter module and the metering module; and
the second device,
wherein
the first device and the second device are nodes of a network and communicate with each other over a plurality of powerlines via the current sensor, and
the plurality of powerlines include the first powerline and a second powerline.

9. The system of claim 1, wherein:
the distributed power source comprises the first device; and
the metering module is configured to, via the transceiver, wirelessly transmit the parameter from the first device to one of the second device and a third device.

10. The system of claim 1, wherein:
the plurality of bus bars include a neutral bus bar and two or more other bus bars; and
the transceiver of the first device is configured to receive over the first powerline and from the second device the voltage value of the first voltage detected between the two of the plurality of bus bars of the distributed power source.

11. A system comprising:
at least one source module in a first device and configured to (i) detect a first voltage between a first pair of a plurality of bus bars of a distributed power source, and (ii) timestamp a first voltage value corresponding to the first voltage with a first timestamp, wherein the plurality of bus bars are in the distributed power source and include three or more bus bars, wherein the distributed power source (i) supplies power from the first pair of the plurality of bus bars to a first load, and (ii) does not supply power from at least one of the plurality of bus bars to the first load, wherein the first load is distinct from the first device,
wherein the at least one source module is configured to detect a second voltage between a second pair of the plurality of bus bars, wherein the distributed power source supplies power from the second pair of the plurality of bus bars to a second load, and wherein at least one of bus bar in the second pair of the plurality of bus bars is not in the first pair of the plurality of bus bars;
at least one load module in a second device, connected to a current sensor via wires, and configured to, via the wires, detect a current drawn from the first pair of the plurality of bus bars by the first load, wherein the at least one load module is configured to timestamp a first current value corresponding to the detected current drawn from the first pair of the plurality of bus bars with a second timestamp, and
wherein the at least one load module is configured to detect current drawn from the second pair of the plurality of bus bars by the second load;
a parameter module is configured to determine (i) a first parameter of the first load based on the first voltage value, the first current value, the first timestamp, and the second timestamp, and (ii) a second parameter of the second load based on the second voltage and the current drawn from the second pair of the plurality of bus bars; and
a metering module configured to report the parameter.

12. The system of claim 11, wherein the first device comprises the at least one source module and the parameter module.

13. The system of claim 11, wherein the second device comprises the at least one load module and the parameter module.

14. The system of claim 11, comprising:
the first device comprising the at least one source module;
the second device comprising the at least one load module; and
a third device comprising the parameter module,
wherein
the third device is separate from the first device and the second device,
the at least one source module is configured to wirelessly or via a first powerline transmit the voltage value representing the voltage to the parameter module, and
the at least one load module is configured to wirelessly or via a second powerline transmit the current value representing the current to the parameter module.

15. The system of claim 14, wherein:
the first device, the second device, and the third device are mesh nodes of a mesh network; and
the first device, the second device, and the third device comprise transceivers that communicate with each other using a time synchronized mesh protocol.

16. The system of claim 14, wherein:
the first device, the second device, and the third device are nodes of a network; and
the first device, the second device, and the third device comprise transceivers that communicate with each other the first powerline and the second powerline.

17. The system of claim 16, wherein at least two of the first device, the second device, and the third device communicate with each via the current sensor.

18. The system of claim 16, wherein the first device, the second device, and the third device are time synchronized and share parameters of loads associated with nodes in the network.

19. The system of claim 16, wherein the first device comprises the parameter module and the metering module.

20. The system of claim 16, wherein the second device comprises the parameter module and the metering module.

21. The system of claim 11, wherein:
the power source is a breaker panel box; and
the load is remotely located away from the breaker panel box and receives power from the breaker panel box.

22. The system of claim 11, wherein the parameter module is configured to determine the parameter based on at least one of:
a distance between (i) terminals of the at least one source module and (ii) terminals of the current sensor, and
impedance of a wire between (ii) the terminals of the at least one source module and (ii) the terminals of the current sensor.

23. The system of claim 11, wherein:
the at least one source module is configured to timestamp a second voltage value corresponding to the second voltage with a third timestamp;
the at least one load module is configured to timestamp a current value corresponding to the detected current drawn from the second pair of the plurality of bus bars with a fourth timestamp; and
the parameter module is configured to determine the second parameter of the second load based on the third timestamp and the fourth timestamp.

24. The system of claim 11, wherein the second voltage is different than the first voltage.

25. A system comprising:
a source module in a first device and configured to detect a first voltage between two of a plurality of bus bars, wherein the plurality of bus bars are a distributed power source, wherein the distributed power source supplies power from the two of the plurality of bus bars to a load, and wherein the load is distinct from the first device;
a first load module in a second device and configured to detect a current drawn from the two of the plurality of bus bars by the load, wherein the second device is distinct from the first device;
a parameter module, wherein the source module, the load module, and the parameter module are time synchronized with each other and share times when the first voltage and the current are detected, and wherein the parameter module is configured to
(i) estimate a second voltage at a current sensor based on
a voltage value of the first voltage,
a predetermined distance between (i) terminals where the first voltage is detected at the two of the plurality of bus bars and (ii) the current sensor, and
a predetermined impedance of power lines between (i) the terminals where the first voltage is detected at the two of the plurality of bus bars and (ii) the current sensor, and
(ii) determine a parameter of the load based on the second voltage, the current and the times when the first voltage and the current are detected, wherein the second voltage is different than the first voltage; and
a metering module configured to report the parameter.

26. The system of claim 25, further comprising:
the first device comprising the source module;
the second device comprising the load module;
a third device comprising the parameter module; and
a fourth device comprising a second load module,
wherein
the second load module is configured to (i) via a second current sensor, detect current drawn from the distributed power source by a second load, and (ii) transmit a current value representing the current drawn by the second load to the parameter module,
the second current sensor is remotely located away from the distributed power source, and
the parameter module is configured to (i) estimate a third voltage at the second current sensor based on the first voltage, and (ii) determine at least one parameter of the second load based on the third voltage and the current value representing the current drawn by the second load.

27. The system of claim 26, wherein:
the first device, the second device, and the third device are mesh nodes of a network;
the first device, the second device, and the third device comprise transceivers that communicate with each other over powerlines; and
the first device, the second device, and the third device are time synchronized and share parameters of loads associated with nodes in the network.

28. The system of claim 27, wherein at least two of the first device, the second device, and the third device communicate with each other over via the current sensor.

29. The system of claim 26, wherein:
the first device, the second device, and the third device are mesh nodes of a mesh network; and
the first device, the second device, and the third device comprise transceivers that communicate with each other using a time synchronized mesh protocol.

30. The system of claim 29, wherein the first device, the second device, and the third device are time synchronized and share parameters of loads associated with nodes in the mesh network.

31. A system comprising:
a transceiver in a first device and configured to receive wirelessly or over a first powerline and from a second device (i) a voltage value of a first voltage detected between two of a plurality of bus bars, wherein the plurality of bus bars are in a distributed power source, wherein the distributed power source supplies power from the two of the plurality of bus bars to a load, and wherein the load is distinct from the first device and the second device, or (ii) a first current value of a current detected by a current sensor and drawn from the two of the plurality of bus bars by the load, wherein the current sensor is remotely located away from the distributed power source;
a sensing module configured to one of (i) if the transceiver receives the first current value, detect the first voltage and timestamp the voltage value with a first timestamp, and (ii) if the transceiver receives the voltage value, determine a second current value of the current drawn by the load and timestamp the second current value with a second timestamp;
a parameter module configured to
estimate a second voltage at the current sensor based on the voltage value, and
determine at least one parameter of the load based on (a) the second voltage, (b) the first current value or the second current value, (c) the first timestamp, and (d) the second timestamp, wherein the at least one parameter includes (i) power drawn by the load, and (ii) energy used by the load; and
a metering module configured to report the at least one parameter,
wherein
the sensing module is connected to the two of the plurality of bus bars of the distributed power source and detects the first voltage between the two of the plurality of bus bars; and
the parameter module is configured to estimate the second voltage at the current sensor based on (i) a predetermined distance between the two of the plurality of bus bars and the current sensor, and (ii) a predetermined impedance of the first powerline or a second powerline between the two of the plurality of bus bars and the current sensor.

32. The system of claim 31, wherein:
at least one of the two of the plurality of bus bars receives direct current; and
the current drawn from the two of the plurality of bus bars is the direct current.

* * * * *